United States Patent
Chun

[11] Patent Number: 5,856,212
[45] Date of Patent: Jan. 5, 1999

[54] METHOD OF PRODUCING SEMICONDUCTOR PACKAGE HAVING SOLDER BALLS

[75] Inventor: Heung Sop Chun, Choongchungbook-Do, Rep. of Korea

[73] Assignee: Goldstar Electron Co., Ltd., Cheongju, Rep. of Korea

[21] Appl. No.: 646,569

[22] Filed: May 8, 1996

Related U.S. Application Data

[62] Division of Ser. No. 368,442, Jan. 4, 1995, abandoned.

[30] Foreign Application Priority Data

May 11, 1994 [KR] Rep. of Korea ................ 1994/10322

[51] Int. Cl.$^6$ ................................................. H01L 21/44
[52] U.S. Cl. ............................................ 438/126; 438/125
[58] Field of Search ..................... 437/183, 217; 257/738, 780; 438/613, 125, 126

[56] References Cited

U.S. PATENT DOCUMENTS

| | | | |
|---|---|---|---|
| 5,025,307 | 6/1991 | Ueda et al. | 361/397 |
| 5,403,776 | 4/1995 | Tsuji et al. | 437/183 |
| 5,461,197 | 10/1995 | Hiruta et al. | 174/52.4 |
| 5,468,999 | 11/1995 | Lin et al. | 257/784 |
| 5,608,265 | 3/1997 | Kitano et al. | 257/738 |
| 5,616,962 | 4/1997 | Ishikawa et al. | 257/777 |
| 5,648,683 | 7/1997 | Takahashi | 257/685 |

FOREIGN PATENT DOCUMENTS

| | | |
|---|---|---|
| 59-161851 | 9/1984 | Japan . |
| 63-296252 | 12/1988 | Japan . |
| 63-300543 | 12/1988 | Japan . |
| 1-191455 | 8/1989 | Japan . |
| 3-105934 | 5/1991 | Japan . |
| 5-335433 | 12/1993 | Japan . |
| 6-209065 | 7/1994 | Japan . |
| 89/04552 | 5/1989 | WIPO . |

Primary Examiner—Olik Chaudhuri
Assistant Examiner—Kevin F. Turner
Attorney, Agent, or Firm—Fleshner & Kim

[57] ABSTRACT

A semiconductor package with solder balls and a method for producing the package are disclosed. The package has no outer lead but is provided with the solder balls formed on the mold resin body, thus to allow a plurality of packages to be easily vertically layered when enlarging the memory capacity. The package producing method forms the solder balls through screen printing or dotting, or electroplating and vacuum depositing of solder paste, thus to need no typical forming step and to achieve the thinness of the package. A plurality of holes are provided in at least one of the top section and the bottom section of the mold resin body such that the holes communicate with the inner leads respectively. The solder balls are formed on the holes under the condition that a plurality of conductors are charged in the holes. The solder balls are electrically connected to the inner leads through the conductors.

6 Claims, 5 Drawing Sheets

METHOD OF PRODUCING SEMICONDUCTOR PACKAGE HAVING SOLDER BALLS

This application is a division of application Ser. No. 08/368,442 filed Jan. 4, 1995, now abandoned.

BACKGROUND OF THE INVENTION

1. Field of the Invention

The present invention relates in general to semiconductor packages with solder balls and a method for producing such packages and, more particularly, to an improvement in structure of such packages as well as to an improvement in the package producing method for removing outer leads exposed to the outside of the packages and for letting the packages be easily layered vertically in order for enlarging memory capacity.

2. Description of the Prior Art

With reference to FIG. 1, there is shown a plastic BGA (ball grid arrays) package which is a representative example of typical semiconductor packages with solder balls. In the drawing, the reference numeral 1 denotes a semiconductor chip. The semiconductor chip 1 is bonded to the top surface of a PCB (printed circuit board) 2 using a die bonding epoxy 3. A solder resist 4, which is provided on the bottom surface of the PCB 2, includes a plurality of holes "s" for receiving a plurality of solder balls 5 respectively, which solder balls 5 are electrically connected to the PCB 2 and protrude out of the bottom surface of the solder resist 4, thus to electrically lead the PCB 2 to the outside of the package. The holes "s" of the solder resist 4 are spaced out at regular intervals.

A plurality of pads of the semiconductor chip 1 are electrically connected to a plurality of inner leads 8 of a lead frame by means of a plurality of metal wires 7, which metal wires 7 are bonded to the chip 1 and to the inner leads 8 of the lead frame at their opposed ends respectively. The inner leads 8 include a through hole 6 at a predetermined portion, which through hole 6 is provided with a metal pattern (not shown) therein. A predetermined volume including the semiconductor chip 1 and the metal wires 7 is hermetically packaged by a plastic resin body 9.

The above plastic BGA package is produced by the following process.

The BGA package producing process is started at a die bonding step in which the semiconductor chip 1 is bonded to the top surface of the PCB 2 using the die bonding epoxy 3. The die bonding step is followed by a wire bonding step for electrically connecting the pads of the semiconductor chip 1 to the inner leads 8 of the lead frame by means of the metal wires 7. After the wire bonding step, a molding step for hermetically molding, using the plastic resin, the predetermined volume including the semiconductor chip 1, the inner leads 8 of the lead frame and the metal wires 7 is carried out, thus to form the plastic resin body 9. The molding step is followed by a trimming and forming step in which lead supporting dambars (not shown) are cut and a plurality of outer leads (not shown) of the lead frame are trimmed and formed into a predetermined bent shape.

In the plastic BGA package produced through the above process, the semiconductor chip is electrically connected to the inner leads of the lead frame by means of the plurality of the metal wires, which metal wires are bonded to the chip and to the inner leads in the wire bonding step. In addition, the outer leads of the lead frame are exposed to the outside of the plastic resin body hermetically packaging the predetermined volume including the semiconductor chip, the inner leads of the lead frame and the metal wires. However, the above plastic BGA package has a problem that it is very difficult to achieve the recent trend of diminution and thinness of the package. Furthermore, when a plurality of above packages will be used together in order to enlarge memory capacity, the packages are inevitably arrayed horizontally due to the outer leads exposed to the outside, thus to waste space.

SUMMARY OF THE INVENTION

It is, therefore, an object of the present invention to provide a semiconductor package in which the above problems can be overcome and which has no outer lead exposed to the outside of a mold resin body of the package but is provided with solder balls formed on at least one of the top surface and the bottom surface of the mold resin body, thus to prevent twisting of the lead frame and coming-off of the package and to allow a plurality of packages to be easily vertically layered using the solder balls as electric terminals when enlarging the memory capacity.

It is another object of the present invention to provide a method for producing the semiconductor package with solder balls, which method needs no typical forming step as it forms the solder balls through screen printing or dotting, or electroplating and vacuum depositing of solder paste, thus to simplify the package production process and to achieve the recent trend of thinness of the package.

In an aspect, the present invention provides a semiconductor package comprising a semiconductor chip, a lead frame for holding the chip and forming a passage for electrically leading the chip to the outside of the package, a plurality of electric connection members for electrically connecting the chip to a plurality of inner leads of the lead frame, and a mold resin body for packaging a predetermined volume including the chip, the lead frame and the electric connection members, further comprising: a plurality of holes provided in at least one of a top section and a bottom section of the mold resin body such that the holes communicate with the inner leads respectively; a plurality of conductors charged in the holes respectively; and a plurality of solder balls provided on the holes of the mold resin body and electrically connected to the inner leads through the conductors respectively.

In another aspect, the present invention provides a method for producing a semiconductor package with solder balls comprising; a sawing step for dividing a wafer into a plurality of semiconductor chips; a die attaching step for attaching one of the semiconductor chips to a plurality of inner leads of a lead frame using die attaching epoxy; a wire bonding step for electrically connecting a plurality of pads of the chip to the inner leads by means of a plurality of metal wires; a molding step for packaging a predetermined volume including the chip, the lead frame and the metal wires by a mold resin body and for providing a plurality of holes for the mold resin, the holes communicating with the inner leads of the lead frame; and a soldering step for charging conductors in the holes respectively and for forming a plurality of solder balls on the holes by reflow soldering such that the solder balls protrude out of a surface of the mold resin body and are electrically connected to the inner leads through the conductors.

BRIEF DESCRIPTION OF THE DRAWINGS

Other objects and aspects of the invention will become apparent from the following description of embodiments with reference to the accompanying drawings in which:

FIGS. 2A to 2C are sectional views of semiconductor packages in accordance with a primary embodiment of the present invention respectively, in which:

FIG. 2A shows a wire bonding type package;

FIG. 2B shows an LOC (lead on chip) type package; and

FIG. 2C shows a tab type package;

FIGS. 3A to 3C are sectional views of semiconductor packages in accordance with a second embodiment of the present invention respectively, in which:

FIG. 3A shows a wire bonding type package;

FIG. 3B shows an LOC type package; and

FIG. 3C shows a tab type package;

FIGS. 4A and 4B are plan views showing hole arrangements of semiconductor packages in accordance with the present invention respectively, in which:

FIG. 4A shows an in-line hole type package; and

FIG. 4B shows zigzag hole type package;

DESCRIPTION OF THE PREFERRED EMBODIMENTS

Figure 1:
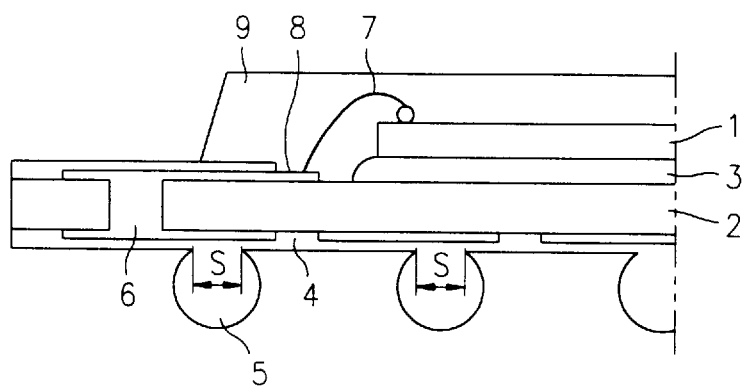
FIG. 1 is sectional view of a typical plastic BGA (ball grid arrays) package.
Figure 2A:
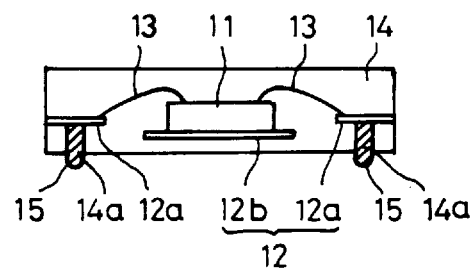
Figure 2B:
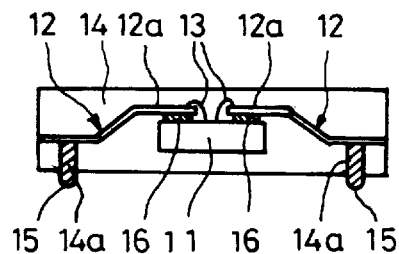
Figure 2C:
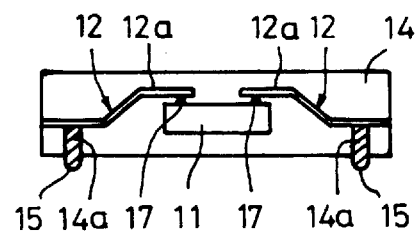

FIGS. 2A to 2C are sectional views of semiconductor packages in accordance with a primary embodiment of the present invention respectively.

Referring first to FIG. 2A, there is shown a wire bonding type semiconductor package. In this drawing, the reference numeral 12b denotes a paddle of a lead frame 12, which paddle 12b is adapted for holding thereon a semiconductor chip 11 having a plurality of pads. The pads of the chip 11 on the paddle 12b are electrically connected to a plurality of inner leads 12a of the lead frame 12 by means of a plurality of electric connection members 13 such as bonding wires. A predetermined volume including the semiconductor chip 11, the lead frame 12 having the inner leads 12a and the paddles 12b is hermetically packaged using a mold resin, thus to form a mold resin body 14.

The mold resin body 14 is provided with a plurality of holes 14a communicating with the inner leads 12a of the lead frame 12. In the present invention, the holes 14a may be provided in at least one of the top section and the bottom section of the mold resin body 14. In the primary embodiment of FIGS. 2A to 2C, the holes 14a are formed in the bottom section of the mold resin body 14. Each of the holes 14a of the mold resin body 14 is charged with a conductor and provided with a solder ball 15, which solder ball is electrically connected to an associated inner lead 12a of the lead frame 12 through an associated conductor. The solder balls 15 formed on the holes 14a protrude out of the bottom surface of the mold resin body 14 and are used as electric terminals for outputting signals from the chip 11. If briefly described, the above wire bonding type package has no outer lead (not shown) typically extending out of the mold resin body 14 but is provided with the solder balls 15 which are electrically connected to the inner leads 12a and electrically leads the inner leads 12a to the outside of the mold resin body 14. With the solder balls 15, the semiconductor package can be mounted to a surface of a printed circuit board (not shown) in the same manner as that of a conventional outer lead type package.

Turning to FIG. 2B, there is shown an LOC (lead on chip) type package. Differently from the wire bonding type package of FIG. 2A, the LOC type package uses no paddle but directly attaches a semiconductor chip 11 to the bottom surfaces of the inner leads 12a of the lead frame 12 using polyimide films 16. After attaching the chip 11 to the inner leads 12a, the pads of the chip 11 are electrically connected to the inner leads 12a by means of the plurality of electric connection members 13 such as metal wires. The solder balls 15 of the above LOC package are formed in the same manner as described for the wire bonding type package of FIG. 2A and further explanation is thus not deemed necessary.

FIG. 2C shows a tab type semiconductor package with solder balls in accordance with the primary embodiment of the invention.

In the tab type package of FIG. 2C, a plurality of solder bumps 17 are provided on the bottom surfaces of the plurality of inner leads 12a of the lead frame 12 respectively. After providing the solder bumps 17 for the inner leads 12a, the semiconductor chip 11 is electrically connected to the inner leads 12a by means of the solder bumps 17. That is, the solder bumps 17 of the tab type package of FIG. 2C substitute both the electric connection members 13 and the polyimide films 16 of the LOC package of FIG. 2B.

In each of the above semiconductor packages in accordance with the primary embodiment of the invention, the predetermined volume including the semiconductor chip 11, the lead frame 12 and the electric connection members 13 is hermetically packaged using mold resin, thus to form the mold resin body 14. In addition, the bottom section of the mold resin body 14 is provided with the plurality of holes 14a communicating with the inner leads 12a or with the lead frame 12. The holes 14a is charged with the conductors and provided with the solder balls 15, which solder balls 15 protrude out of the holes 14a and electrically lead the inner leads 12a or the lead frame 12 to the outside of the mold resin body 14 through the conductors charged in the holes 14a.

Figure 4A:
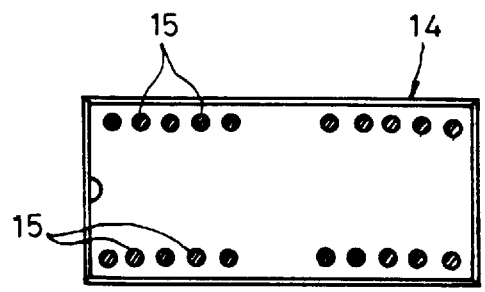
Figure 4B:
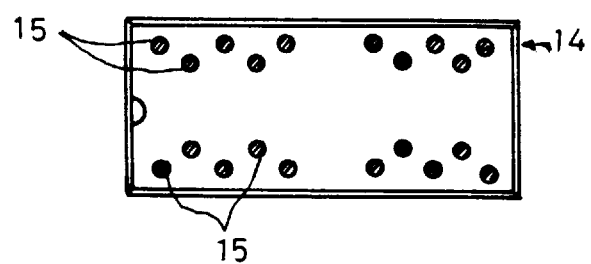

In the primary embodiment of the invention, the holes 14a which are provided in the top section or in the bottom section of the mold resin body 14 of the package may be arranged in a straight line and spaced out at predetermined regular intervals as shown in FIG. 4A. This package is named as an in-line hole type package. Alternatively, the holes 14a may be arranged in a zigzag line and spaced out at predetermined regular intervals as shown in FIG. 4B. This package is named as a zigzag hole type package.

Figure 3A:
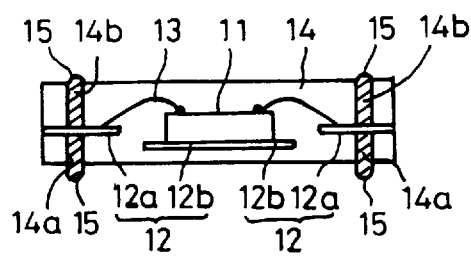
Figure 3B:
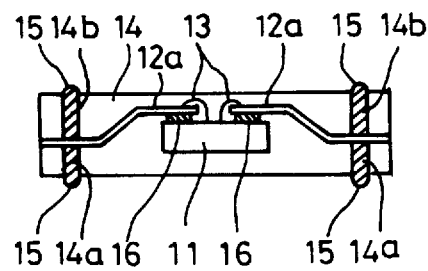
Figure 3C:
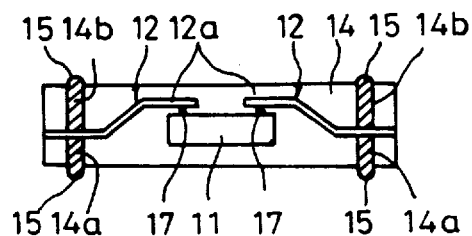

Referring next to FIGS. 3A to 3C, there are shown a wire bonding type semiconductor package, an LOC type package and a tab type package in accordance with a second embodiment of the present invention respectively. As shown in these drawings, the mold resin body 14 of each semiconductor package according to the second embodiment is provided with a plurality of holes 14a and 14b communicating with the inner leads 12a of the lead frame 12, which holes 14a and 14b are provided in the bottom section and in the top section of the mold resin body 14 respectively. The holes 14a and 14b are charged with conductors. The packages having the conductors in the holes 14a and 14b in turn are processed in a reflow oven (not shown) for forming of solder balls 15 through reflow soldering. At this time, the plurality of solder balls 15 are formed on the holes 14a and 14b of the mold resin body 14 respectively. With the solder balls 14a and 14b, a plurality of packages according to the second embodiment can be more easily layered vertically when enlarging the memory capacity. When vertically layering the packages, the packages are automatically arrayed due to the solder balls 15, so that the vertical layering of the packages is more facilitated. The other constructions of the packages of the second embodiment remain the same as those described for the packages of the primary embodiment and further explanation for the constructions is thus not deemed necessary.

The semiconductor packages shown in FIGS. 3B and 3C have no paddle. In those semiconductor packages, the general shapes of the packages remain the same as those of the packages shown in FIGS. 2B and 2C but the plurality of holes 14a and 14b are provided in the bottom section and the top section of the mold resin body 14 respectively.

In the semiconductor packages of the second embodiment, the holes 14a and 14b which are provided in the mold resin body 14 may be arranged in a straight line and spaced out at predetermined regular intervals as shown in FIG. 4A. Alternatively, the holes 14a may be arranged in a zigzag line and spaced out at predetermined regular intervals as shown in FIG. 4B.

Hereinbelow, a method for producing the above semiconductor packages with the solder balls, for example, one of the packages according to the primary embodiment, will be described.

In order to produce a semiconductor package of the primary embodiment, a semiconductor wafer (not shown) is divided into a plurality of semiconductor chips 11 through a sawing step. The sawing step is followed by a die attaching step in which one of the semiconductor chips 11 is attached to the inner leads 12a of the lead frame 12 using the polyimide films 16. Thereafter, a wire bonding step is carried out. In the wire bonding step, the pads of the chip 11, which chip 11 is attached to the inner leads 12a, are electrically connected to the inner leads 12a by means of a plurality of high purity metal wires, for example, gold wires, aluminum wires or copper wires. In the above embodiments of the invention, the high purity metal wires are named as the electric connection members 13.

The wire bonding step is followed by a package molding step. In the molding step, the predetermined volume including the semiconductor chip 11, the inner leads 12a of the lead frame 12 and the electric connection members 13 or the high purity metal wires is hermetically packaged using the mold resin, thus to form the mold resin body 14. In this molding step, the plurality of holes 14a are formed in the bottom section of the mold resin body 14 such that the holes 14a communicate with the inner leads 12a of the lead frame 12. The molding step is followed by a soldering step. In the soldering step, the holes 14a are charged with conductors and, thereafter, the package with the conductors are processed in the reflow oven (not shown) for reflow soldering. As a result of the reflow soldering, the plurality of solder balls 15 are formed on the holes 14a respectively in such a manner that the solder balls 15 partially protrude out of the holes 14a and are electrically connected to the inner leads 12a through the conductors. In the soldering step, it should be understood that the solder balls 15 may be formed by screen printing or dotting a solder paste. Alternatively, the solder balls 15 may be formed by electroplating and vacuum depositing the solder paste.

After the soldering step, a conventional trimming step and a conventional marking step are orderly carried out, thus to provide the semiconductor package with solder balls of the primary embodiment of the invention. Of course, the above process will be simply adapted for production of the packages of the second embodiment of the invention. In forming of the holes, for example, the holes 14a and 14b formed in the bottom section and in the top section of the mold resin body 14 as shown in FIGS. 3A to 3C, it is preferred to provide hole forming structures for conventional top and bottom molds (not shown) used in the molding step. When molding the mold resin body 14 using the top and bottom molds with the above hole forming structures, the mold resin body 14 is naturally provided with the holes 14a and 14b in its bottom section and in its top section respectively. Of course, the hole forming structures may be adapted for forming the holes 14a of the mold resin body 14 of the packages of the primary embodiment.

When the semiconductor packages have the solder balls 15 in the holes 14a and 14b formed in the bottom sections and in the top sections of the mold resin bodies 14 as shown in FIGS. 3A to 3C, the packages are suitable for vertical layering of the packages for enlarging memory capacity. An example of the vertical layering of the packages of the second embodiment is shown in FIG. 5.

Figure 5:
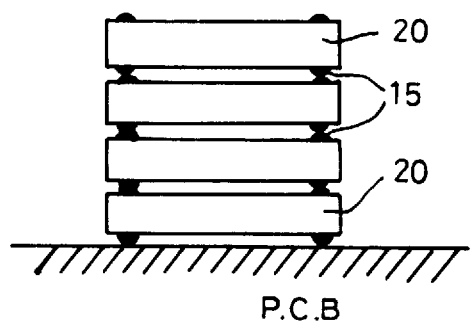
FIG. 5 is a sectional view showing a plurality of semiconductor packages of the present invention vertically layered in order for enlarging memory capacity.
Figure 6:
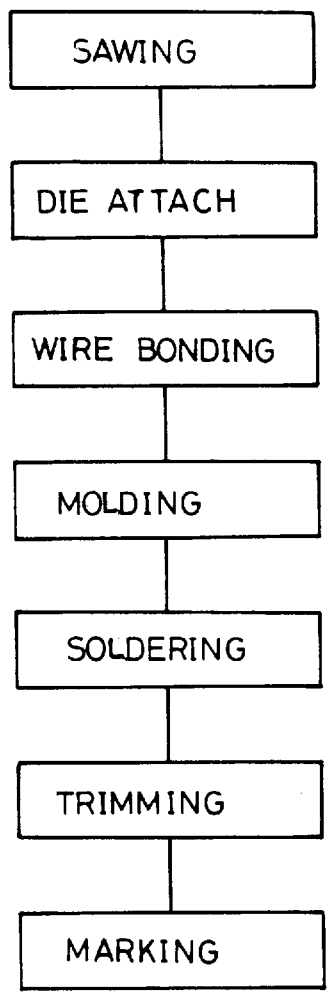
FIG. 6 is a flowchart of a method for producing a semiconductor package with solder balls in accordance with the present invention.

FIG. 5 is a sectional view showing four semiconductor packages of the second embodiment, which packages are vertically layered in order for enlarging the memory capacity four times. The four semiconductor packages 20 are vertically layered in such a manner that their solder balls 15 are electrically connected to each other and integrate the packages 20 into a single body. As shown in this drawing, the vertical layering of the semiconductor packages 20 is more readily achieved due to the solder balls 15.

As described above, the semiconductor packages according to the present invention use solder balls instead of typical outer leads, so that the packages can remove the typical forming step for lead forming from the package production process. In this regard, the packages of the invention are free from possible bad quality of the packages, for example, bending of outer leads or coming-off of the package, caused by the typical forming step. Furthermore, as the packages of the invention have no outer lead extending to the outside of the packages, the packages can be easily handled.

The packages of the invention also achieve the recent trend of thinness of the packages and use the solder balls as electric terminals for outputting signals from their semiconductor chips. With the thinness of the packages and the solder balls used as signal outputting electric terminals, the packages of the invention not only facilitate management of the packages but also improve test performances of the packages.

Another advantage of each of the packages of the invention is resided in that a plurality of packages can be easily arranged due to the solder balls when layering the packages vertically in order for enlarging the memory capacity. Therefore, the packages of the invention not only improve working efficiency in package layering but also achieve package quality improvement.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A method of producing a semiconductor package having solder balls comprising the steps of:

electrically connecting a plurality of bond pads of a semiconductor chip to a plurality of inner leads of a lead frame with a plurality of conductive media;

packaging said chip, said lead frame and said conductive media in a mold resin body such that a plurality of holes are formed on only a single side of the resin body and communicate with corresponding ones of the plurality of inner leads of the lead frame; and charging conductors in the holes; and heating the conductors such that the conductors protrude out of a surface of the mold resin body and are electrically connected to the inner leads.

2. The method according to claim 1, wherein said charging step comprises screen printing of solder paste.

3. The method according to claim 1, wherein said charging step comprises dotting of solder paste.

4. The method according to claim 1, wherein said charging step comprises electroplating and vacuum depositing of solder paste.

5. The method according to claim 1, further comprising a step of attaching said semiconductor chip directly to surfaces of the plurality of inner leads of the lead frame using polyimide film.

6. The method of claim 1, wherein the packaging step comprises packaging the chip, lead frame and conductive media such that said plurality of holes are formed in a zig zag pattern.

* * * * *